United States Patent
Lhee et al.

(10) Patent No.: US 8,227,977 B2
(45) Date of Patent: Jul. 24, 2012

(54) STRUCTURE FOR REPAIRING A LINE DEFECT OF AN ORGANIC LIGHT EMITTING DISPLAY AND A METHOD OF REPAIRING THE DEFECT

(75) Inventors: Zail Lhee, Yongin (KR); Keun Kim, Yongin (KR); Jin-Gyu Kang, Yongin (KR)

(73) Assignee: Samsung Mobile Display Co., Ltd. (KR)

( * ) Notice: Subject to any disclaimer, the term of this patent is extended or adjusted under 35 U.S.C. 154(b) by 217 days.

(21) Appl. No.: 12/540,634

(22) Filed: Aug. 13, 2009

(65) Prior Publication Data
US 2010/0039016 A1     Feb. 18, 2010

(30) Foreign Application Priority Data
Aug. 14, 2008   (KR) .......................... 10-2008-0079877

(51) Int. Cl.
H01L 51/50 (2006.01)
H01L 51/52 (2006.01)
H01L 51/56 (2006.01)
H01J 9/50 (2006.01)

(52) U.S. Cl. ....... 313/505; 445/2; 445/61; 257/E21.596; 438/4

(58) Field of Classification Search ................ 445/2, 62, 445/61; 438/4, 434; 257/59, 72, E21.131, 257/E21.596; 313/498–512
See application file for complete search history.

(56) References Cited

U.S. PATENT DOCUMENTS

| | | | | |
|---|---|---|---|---|
| 4,894,690 A | * | 1/1990 | Okabe et al. | 257/59 |
| 5,883,437 A | * | 3/1999 | Maruyama et al. | 257/773 |
| 6,307,216 B1 | * | 10/2001 | Huh et al. | 257/59 |
| 6,441,401 B1 | * | 8/2002 | Jung et al. | 257/72 |
| 6,630,976 B2 | * | 10/2003 | Ahn et al. | 349/139 |
| 7,471,351 B2 | * | 12/2008 | Choi | 349/54 |
| 7,700,949 B2 | * | 4/2010 | Song et al. | 257/59 |
| 7,824,930 B2 | * | 11/2010 | Koshiishi et al. | 438/14 |
| 7,842,953 B2 | * | 11/2010 | Ku | 257/59 |
| 7,884,364 B2 | * | 2/2011 | Kim et al. | 257/59 |
| 2001/0035920 A1 | * | 11/2001 | Choi | 349/54 |
| 2003/0107039 A1 | * | 6/2003 | Jung et al. | 257/72 |
| 2004/0090566 A1 | * | 5/2004 | Jung et al. | 349/43 |
| 2004/0169781 A1 | * | 9/2004 | Lee et al. | 349/54 |
| 2005/0030441 A1 | * | 2/2005 | Song | 349/43 |
| 2005/0094081 A1 | | 5/2005 | Lee | |

(Continued)

FOREIGN PATENT DOCUMENTS

JP    10232412    9/1998

(Continued)

OTHER PUBLICATIONS

Jul. 29, 2010 Office Action for Chinese Application No. 2009 10166721.9, which also claims priority to Korean priority Application No. 10-2008-0079877.

(Continued)

*Primary Examiner* — Anne Hines
*Assistant Examiner* — Jose M Diaz
(74) *Attorney, Agent, or Firm* — Knobbe Martens Olson & Bear LLP

(57) ABSTRACT

A structure for repairing a line defect in which a short can be easily repaired using an adjacent wiring line despite limited repairing space and a method of repairing the defect are disclosed.

17 Claims, 4 Drawing Sheets

U.S. PATENT DOCUMENTS

| | | | |
|---|---|---|---|
| 2006/0197886 A1* | 9/2006 | Lai | 349/54 |
| 2007/0259455 A1* | 11/2007 | Chen et al. | 438/4 |
| 2008/0049155 A1 | 2/2008 | Yagi et al. | |
| 2008/0254701 A1* | 10/2008 | Koshiishi et al. | 445/2 |
| 2010/0141849 A1* | 6/2010 | Enda et al. | 348/731 |
| 2011/0273491 A1* | 11/2011 | Iida et al. | 345/690 |

FOREIGN PATENT DOCUMENTS

| | | |
|---|---|---|
| JP | 2003248439 | 9/2003 |
| JP | 2005-043639 | 2/2005 |
| JP | 2008500562 | 1/2006 |
| JP | 2007005706 | 1/2007 |
| JP | 2007096077 | 4/2007 |
| JP | 2008072064 | 3/2008 |
| KR | 10-2000-0060802 | 10/2000 |
| KR | 2000-0060802 | 10/2000 |
| KR | 10-2002-007968 | 10/2002 |
| KR | 2002-0077968 | 10/2002 |

OTHER PUBLICATIONS

Sep. 27, 2010 Office Action for corresponding Korean Application No. 10-2008-0079877.

Office Action dated Mar. 29, 2010, in corresponding Korean priority application No. KR 2008-0079877.

* cited by examiner

STRUCTURE FOR REPAIRING A LINE DEFECT OF AN ORGANIC LIGHT EMITTING DISPLAY AND A METHOD OF REPAIRING THE DEFECT

CROSS-REFERENCE TO RELATED APPLICATION

This application claims priority to and the benefit of Korean Patent Application No. 10-2008-0079877, filed on Aug. 14, 2008, in the Korean Intellectual Property Office, the entire content of which is incorporated herein by reference.

BACKGROUND

1. Field

The field relates to a structure for a repairing line defect in an organic light emitting display and a method of repairing the same, and more particularly, to a structure for repairing a line defect of an organic light emitting display in which a short between wiring lines is repaired and a method of repairing the same.

2. Description of the Related Technology

An organic light emitting display, which is a type of a flat panel display (FPD) using an organic light emitting diode (OLED). The OLED is a self-emission device, and has high brightness and color purity.

The organic light emitting display receives scan signals, data signals, and first and second pixel power sources ELVDD and ELVSS. In addition, in an active matrix organic light emitting display, each pixel includes a plurality of transistors and a capacitor. The active matrix organic light emitting display additionally receives an initializing power source.

Therefore, the organic light emitting display has a more complicated wiring structure than other FPDs such as a liquid crystal display (LCD) and a plasma display panel (PDP).

Therefore, when short a defect occurs between the wiring lines of the organic light emitting display, space for repairing the short defect is limited, such that it is difficult to repair the line defect of the organic light emitting display.

SUMMARY OF CERTAIN INVENTIVE ASPECTS

One aspect is a structure for repairing a short defect between first and second wiring lines of an organic light emitting display. The structure includes an isolated part of the second wiring line, where the isolated part of the second wiring line includes the short between the first and second wiring lines, first and second remaining parts of the second line, where the first and second remaining parts of the second line are electrically isolated from the isolated part of the second wiring line, an isolated part of a third wiring line, where the isolated part of the third wiring line is substantially adjacent to the isolated part of the second wiring line, first and second remaining parts of the third line, where the first and second remaining parts of the third line are electrically isolated from the isolated part of the third wiring line, and a first repair pattern electrically coupling the first and second remaining parts of the second wiring line to the isolated part of the third wiring line.

Another aspect is a method of repairing a short defect between first and second wiring lines of an organic light emitting display. The method includes cutting the second wiring line so that an isolated part of the second wiring line including the short is isolated from first and second remaining parts of the second wiring line, cutting a third wiring line so that an isolated part of the third wiring line is adjacent to the isolated part of the second wiring line, where the isolated part of the third wiring line is isolated from first and second remaining parts of the third wiring line, and forming a first repair pattern to electrically couple the first and second remaining parts of the second wiring line to the isolated part of the third wiring line.

Another aspect is a method of repairing an open defect in a first wiring line of an organic light emitting display, the first wiring line including first and second parts separated by the open, the method including cutting a second wiring line so that an isolated part of the second wiring line is adjacent to the open in the first wiring line, where the isolated part of the second wiring line is isolated from first and second remaining parts of the second wiring line, and forming a first repair pattern to electrically couple the first and second parts of the first wiring line to the isolated part of the second wiring line.

BRIEF DESCRIPTION OF THE DRAWINGS

The accompanying drawings, together with the specification, illustrate exemplary embodiments of the present invention, and, together with the description, serve to explain some of the inventive principles of the present invention.

DETAILED DESCRIPTION OF CERTAIN INVENTIVE EMBODIMENTS

Figure 1:
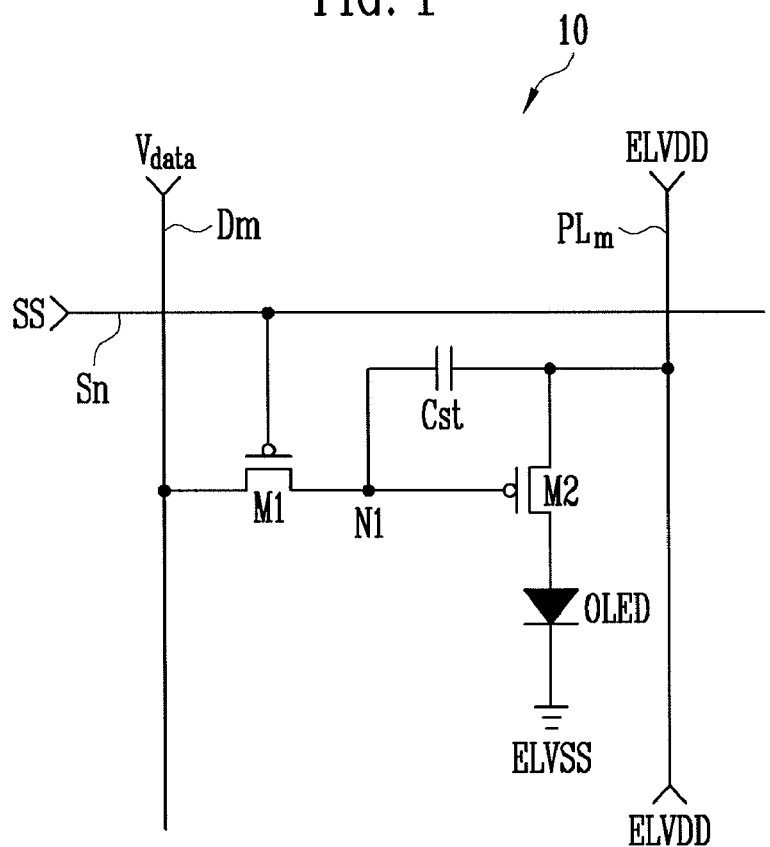
FIG. 1 is a circuit diagram illustrating a pixel of an organic light emitting display according to an embodiment.

Some embodiments include a structure of repairing the line defect of an organic light emitting display capable of easily repairing short defect between wiring lines and a method of repairing the same.

Some embodiments include a structure of repairing line defect of an organic light emitting display in which short defect occurring between first and second wiring lines is repaired. The structure includes the second wiring line of which a part where short defect occurs with respect to the first wiring line is cut off so that a cut part is isolated from a remaining part, a third wiring line disposed adjacent to the second wiring line and having a region adjacent to the part where the short defect occurs is cut off so that a cut part is isolated from remaining parts, and a first repair pattern to electrically couple the remaining part of the second wiring line to the cut part of the third wiring line so that the second wiring line maintains an electric coupling state through the cut part of the third wiring line.

Some embodiments include a method of repairing line defect of an organic light emitting display in which short defect occurring between first and second wiring lines is repaired using a third wiring line adjacent to the second wiring line. The method includes cutting off the second wiring line so that a part in which a short defect occurs with respect to the first wiring line is isolated from a remaining part and cutting off a region of the third wiring line adjacent to the part in which the short defect occurs to isolate the cut part from the remaining parts of the third wiring line and forming a first repair pattern to electrically couple the remaining parts of the second wiring line excluding the part in which the short defect occurs to the cut part of the third wiring line to repair an electric coupling state of the second wiring line.

Accordingly, a wiring line in which a defect occurs may be repaired using an adjacent wiring line so that the wiring line can be easily repaired regardless of space constraints.

In the following detailed description, only certain exemplary embodiments of the present invention have been shown and described, simply by way of illustration. As those skilled in the art would realize, the described embodiments may be modified in various ways, without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals generally refer to like elements.

Hereinafter, certain embodiments of the present invention will be described as follows with reference to the accompanying drawings.

FIG. 1 is a circuit diagram illustrating a pixel of an organic light emitting display according to an embodiment of the present invention.

Referring to FIG. 1, a pixel 10 of an organic light emitting display according to one embodiment includes first and second transistors M1 and M2, a storage capacitor Cst, and an organic light emitting diode (OLED).

The first transistor M1 is coupled between a data line Dm and a first node N1, and the gate electrode thereof is coupled to a scan line Sn. The first transistor M1 is turned on when a scan signal SS is provided from the scan line Sn to supply a data voltage Vdata supplied from the data line Dm to the first node N1.

A second transistor M2 is coupled between a first pixel power source ELVDD and the OLED and has a second transistor M2 coupled to the first node N1. The second transistor M2 controls the amount of current supplied to the OLED in response to the voltage of the first node N1.

The storage capacitor Cst is coupled between the first node N1 and the first pixel power source ELVDD. The storage capacitor Cst stores a voltage difference between the first pixel power source ELVDD and the data voltage Vdata when the data voltage Vdata is supplied to the first node N1 and maintains the difference voltage during each frame.

The OLED is coupled between the second transistor M2 and the second pixel power source ELVSS. The OLED emits light with brightness corresponding to the amount of current supplied from the second transistor M2.

Hereinafter, a method of driving the above-described pixel 10 will be described. For convenience sake, the threshold voltage of the second transistor M2 is not considered.

First, when the low level scan signal SS is supplied to the scan line Sn, the first transistor M1 is turned on. Therefore, the data voltage Vdata supplied from the data line Dm is supplied to the first node N1.

When the data voltage Vdata is supplied to the first node N1, the voltage corresponding to the voltage difference ELVDD-Vdata between the first pixel power source ELVDD and the data voltage Vdata is stored in the storage capacitor Cst.

Then, the second transistor M2 controls the amount of current supplied to the OLED in response to a voltage Vgs between a gate electrode and a source electrode, which is maintained by the storage capacitor Cst. The OLED emits light with the brightness corresponding to the amount of current supplied from the second transistor M2.

As it is noted from the example of the above-described pixel 10, in the organic light emitting display, the emission brightness of the pixel 10 is determined in accordance with the data voltage Vdata supplied through the data line Dm and the voltage value of the first pixel power source ELVDD supplied through a first power source line PLm.

Therefore, in order to display a uniform image, the uniform data voltage Vdata and the uniform first pixel power source ELVDD must be received regardless of the position in which the pixel 10 is provided.

However, when the OLED emits light, since a current path is formed from the first pixel power source ELVDD to the second pixel power source ELVSS via the second transistor M2 and the OLED, voltage drop IR drop occurs in the first power source line PLm. The voltage drop IR Drop increases with distance along the first power source line PLm. Therefore, pixels can receive the first pixel power source ELVDD having different magnitudes in accordance with the positions thereof. In particular, as the size of the organic light emitting display increases, picture quality may deteriorate due to variation in brightness across the display in accordance with the voltage drop of the first pixel power source ELVDD.

Therefore, when the organic light emitting display is designed, the first pixel power source ELVDD is supplied from both sides of the first power source line PLm so that the voltage drop IR Drop of the first pixel power source ELVDD can be reduced.

In addition, the data voltage Vdata is supplied from a plurality of data drivers (not shown) to the data lines Dm from both directions so that the data voltage Vdata can be charged in the pixel 10 at high speed.

That is, in the organic light emitting display, unlike in a liquid crystal display (LCD), bidirectional wiring lines that receive signals (or power sources) in two directions can be formed. Both ends of the bidirectional wiring lines are coupled to a pad or a driving circuit to simultaneously receive signals (or the power sources).

On the other hand, the organic light emitting display has a relatively complicated wiring structure so that a short defect easily occurs between wiring lines.

However, in the organic light emitting display, since the wiring lines are relatively densely arranged, space for repairing the wiring lines is limited, such that it is difficult to repair the wiring lines.

A structure for repairing a line defect in which a short can be easily repaired using an adjacent wiring line despite the limited repairing space and a method of repairing the defect are disclosed.

Figure 2:
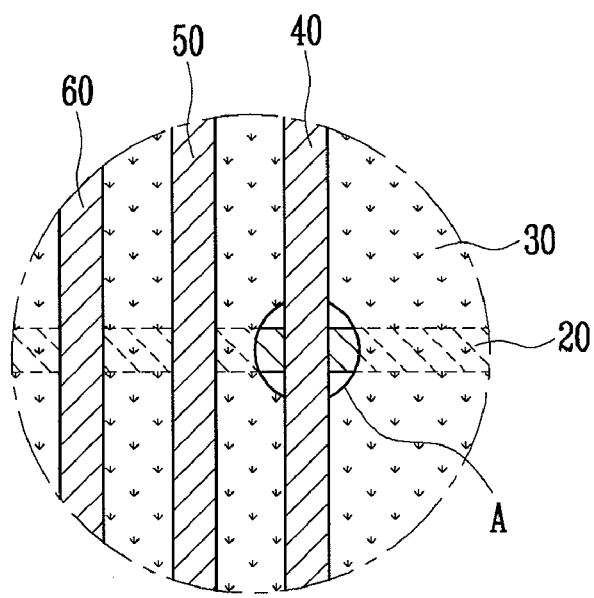
FIG. 2 is a plan view illustrating an example in which short defect occurs between wiring lines.

FIG. 2 is a plan view illustrating an example in which a short defect occurs between wiring lines. FIG. 2 illustrates an example in which the short defect occurs between the wiring lines of different layers.

Referring to FIG. 2, a first wiring line 20 and second, third, and fourth wiring lines 40, 50, and 60 are provided with an insulating layer 30 interposed between wiring line 20 and wiring lines 40, 50, and 60.

The first wiring line 20 (a lower wiring line) is formed under the insulating layer 30 in a first direction (a horizontal direction). For example, the first wiring line 20 can be set as a scan line Sn formed of a gate metal.

The second, third, and fourth wiring lines 40, 50, and 60 (upper wiring lines) are formed on the insulating layer 30 in a second direction (a vertical direction). For example, the second, third and fourth wiring lines 40, 50, and 60 can be source/drain wiring lines such as the first power source line PLm or the data line Dm formed of source/drain metal.

The wiring lines 20, 40, 50, and 60 transmit the scan signals, the first pixel power source ELVDD, and/or the data voltage Vdata while being insulated from each other.

However, the insulating layer 30 may be partially lost in the intersection where the first wiring line 20 and the second wiring line 40 cross each other, illustrated as A. Accordingly a short exists between the first wiring line 20 and the second wiring line 40.

In order to repair the short defect, the second wiring line 40 is cut to isolate a part of the second wiring line 40 in which the short defect occurs from rest of the second wiring line 40.

However, when space for forming a repair pattern between the wiring lines is limited, it may be difficult to reconnect the second wiring line 40. In this case, the second wiring line 40 can be repaired using the third wiring line 50, which is adjacent to the second wiring line 40.

Figure 3A:
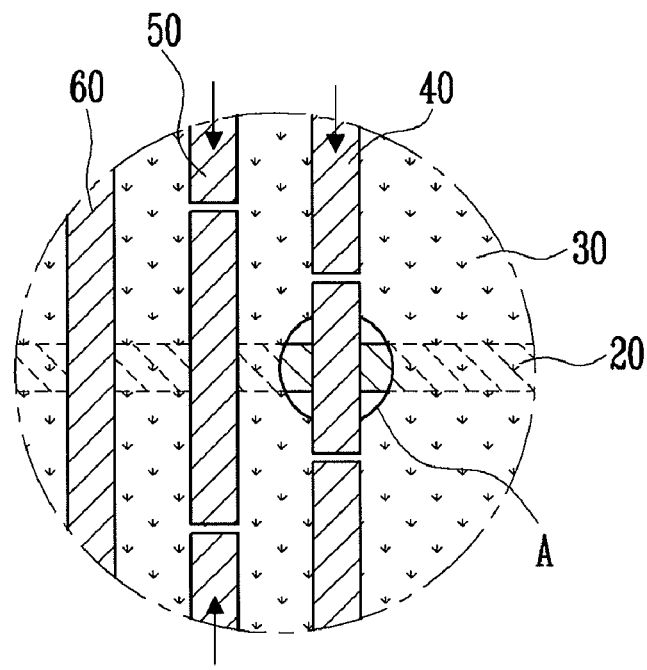
FIGS. 3A and 3B are plan views illustrating a structure for repairing a defect of an organic light emitting display according to an embodiment, and a method of repairing the same.
Figure 3B:
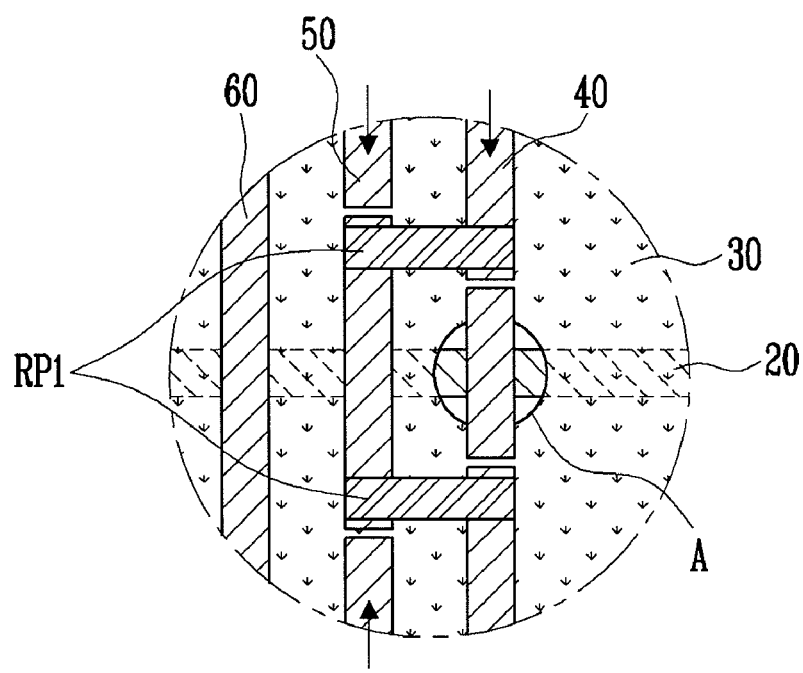

FIGS. 3A and 3B are plan views illustrating a structure for repairing the line defect of an organic light emitting display according to an embodiment. When the third wiring line 50 illustrated in FIG. 2 is a bidirectional wiring line, the short defect between the first and second wiring lines 20 and 40 may be repaired according to the embodiment of FIG. 3B. The arrows in the drawings represent the direction in which signals are applied.

First, referring to FIG. 3A, the second wiring line 40 is cut so that the part having the short defect is isolated from the rest of the second wiring line 40. The second wiring line 40 can be cut using, for example a finely controllable laser.

A portion of the third wiring line 50 adjacent to the isolated part of the second wiring line 40 is cut so that the adjacent part of the third wiring line 50 is isolated from the remaining parts of the third wiring line 50. The third wiring line 50 is cut in order to repair the second wiring line 40. The isolated portion of the third wiring line 50 is longer than the isolated portion of the second wiring line 40.

As illustrated in FIG. 3B, first repair patterns RP1 couple the isolated parts of the second and third wiring lines 40 and 50.

The first repair patterns RP1 can be formed of a conductive material that directly contacts the isolated parts of the second and third wiring lines 40 and 50. The conductive material used for the first repair patterns RP1 can be selected from common wiring line forming materials. Alternatively, when the line defect is repaired where an insulating layer (not shown) is formed on the second, third, and fourth wiring lines 40, 50, and 60, the first repair patterns RP1 can be electrically coupled to the remaining parts of the second and third wiring lines 40 and 50 with contact holes.

As described above, the isolated parts of the second and third wiring lines 40 and 50 are electrically coupled to each other through the first repair patterns RP1. Therefore, the second wiring line 40 is repaired.

Even though a region of the third wiring line 50 is isolated, the third wiring line 50 portions on both sides of the isolated part receive the correct signals because the third wiring line 50 is driven from both sides of the isolated portion of the third wiring line 50. In some embodiments, the range in which the third wiring line 50 is allowed to be cut can be limited so that the power source and/or the signals transmitted by the third wiring line 50 do not unacceptably suffer from the length of the remaining third wiring line 50 portions.

According to the above-described embodiment, the short defect occurring between the first and second wiring lines 20 and 40 can be easily repaired using the adjacent bidirectional wiring line regardless of whether the repairing space is limited.

Figure 4A:
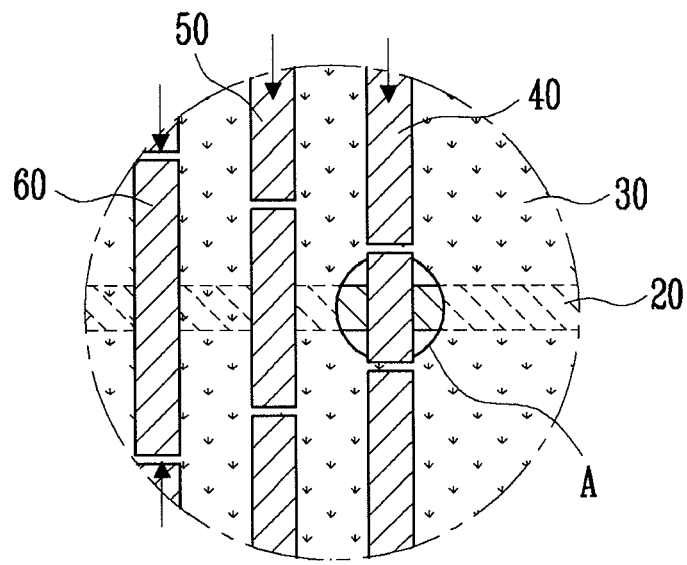
FIGS. 4A and 4B are plan views illustrating a structure for repairing a defect of an organic light emitting display according to another embodiment, and a method of repairing the same.
Figure 4B:
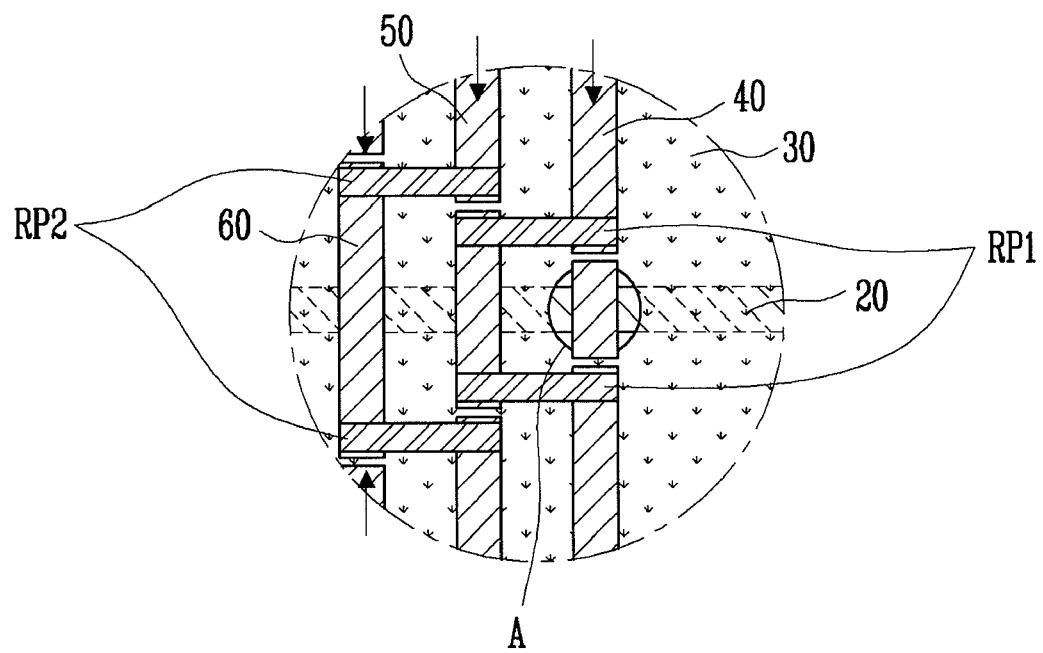

FIGS. 4A and 4B are plan views illustrating a structure for repairing a line defect of an organic light emitting display according to another embodiment. According to the embodiment of FIGS. 4A and 4B, it is assumed that the second third wiring lines illustrated in FIG. 2 are unidirectional wiring lines and that the fourth wiring line is a bidirectional wiring line.

The second, third, and fourth wiring lines 40, 50, and 60 are cut as shown in FIG. 4A, and as described above with regard to the second wiring line 40. Accordingly, each of the second, third, and fourth wiring lines 40, 50, and 60 has an isolated part and a remaining portion on each side of the isolated part. The second wiring line 40 is cut to isolate the short to the first wiring line 20. The third wiring line 50 is cut to repair the second wiring line 40, and the fourth wiring line 60 is cut to repair the third wiring line 50.

As illustrated in FIG. 4B, first repair patterns RP1 are formed for electrically coupling the remaining parts of the second wiring line 40 to the isolated part of the third wiring line 50 and second repair patterns RP2 are formed for electrically coupling the remaining parts of the third wiring line 50 to the isolated part of the fourth wiring line 60.

The materials of the first and second repair patterns RP1 and RP2 are not limited and may be the same or may be different. In some embodiments, the second repair patterns RP2 is formed of the same material and at the same time as the first repair patterns RP1.

As described above, the second and third wiring lines 40 and 50 whose isolated regions are opened by cutting are repaired by forming the first and second repair patterns RP1 and RP2.

In contrast, because the fourth wiring line 60 receives its signals from both sides, the fourth wiring line 60 can function properly despite the opening.

According to above-described embodiments, although a bidirectional wiring line is not directly adjacent to a line having a short defect, the short defect can be easily repaired.

Meanwhile, when repairing any of the wiring lines, if the space for repairing the wiring line is available, the short defect can be repaired without using a bidirectional wiring line.

Figure 5:
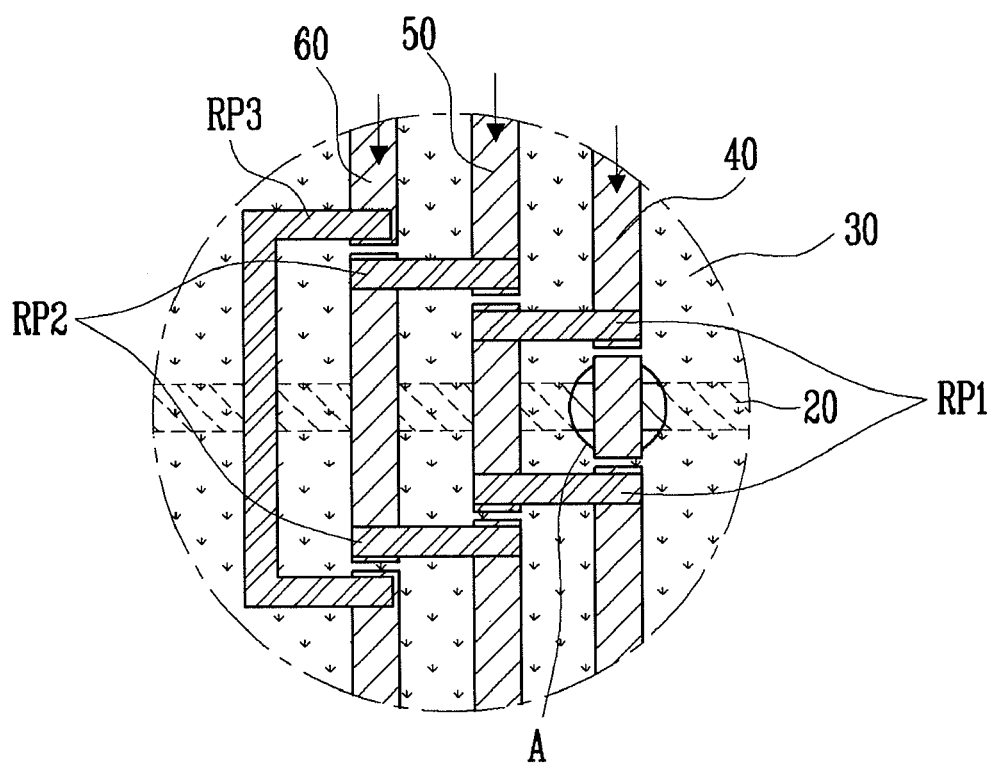
FIG. 5 is a plan view illustrating a structure for repairing a defect of an organic light emitting display according to still another embodiment, and a method of repairing the same.

For example, as illustrated in FIG. 5, although the fourth wiring line 60 is unidirectional, space for a new wiring line is available beside the fourth wiring line 60, so that a third repair pattern RP3 for electrically coupling the remaining parts of the fourth wiring line 60 can be formed.

In the above-described embodiments, the short defect occurring in the intersection between the first and second wiring lines 20 and 40 is repaired. However, the present invention is not limited to the above embodiments. For example, when a short defect occurs between adjacent wiring lines in the same layer, the short defect can be repaired by applying the inventive principles of the above-described embodiments. For example, the short defect can be repaired using the wiring adjacent to the lines having the short.

In addition, when an open defect occurs, the open can be repaired by the processes described above for reconnecting remaining parts of cut wiring lines.

Moreover, when a design can be changed so that the signals are bi-directionally supplied to at least one wiring line among the unidirectional wiring lines around the wiring line where the short defect occurs, the present invention can be applied using the embodiments illustrated in FIGS. 3A to 4B.

While the present invention has been described in connection with certain exemplary embodiments, it is to be understood that the invention is not limited to the disclosed embodiments, but, on the contrary, is intended to cover various modifications and equivalent arrangements.

What is claimed is:

1. A structure for repairing a short defect between first and second wiring lines of an organic light emitting display, the structure comprising:
   an isolated part of the second wiring line, wherein the isolated part of the second wiring line comprises the short between the first and second wiring lines;
   first and second remaining parts of the second wiring line, wherein the first and second remaining parts of the second wiring line are electrically isolated from the isolated part of the second wiring line;
   an isolated part of a third wiring line, wherein the isolated part of the third wiring line is substantially adjacent to the isolated part of the second wiring line;
   first and second remaining parts of the third wiring line, wherein the first and second remaining parts of the third wiring line are electrically isolated from the isolated part of the third wiring line and from one another; and
   a first repair pattern electrically coupling the first and second remaining parts of the second wiring line to the isolated part of the third wiring line,
   wherein the third wiring line is configured to receive signals from both of the first and second remaining parts of the third wiring line.

2. The structure as claimed in claim 1, wherein the second and third wiring lines are disposed to cross the first wiring line with an insulating layer interposed therebetween.

3. The structure as claimed in claim 2, wherein the first wiring line is disposed under the insulating layer.

4. The structure as claimed in claim 2, wherein the second and third wiring lines are disposed parallel on the insulating layer.

5. The structure as claimed in claim 1, further comprising:
   an isolated part of a fourth wiring line, wherein the isolated part of the fourth wiring line is substantially adjacent to the isolated part of the third wiring line;
   first and second remaining parts of the fourth line, wherein the first and second remaining parts of the fourth line are electrically isolated from the isolated part of the fourth wiring line; and
   a second repair pattern electrically coupling the first and second remaining parts of the third wiring line to the isolated part of the fourth wiring line.

6. The structure as claimed in claim 5, wherein the fourth wiring line is configured to receive signals from both of the first and second remaining parts of the fourth wiring line.

7. The structure as claimed in claim 5, further comprising a third repair pattern electrically coupling the first and second remaining parts of the fourth wiring line.

8. A method of repairing a short defect between first and second wiring lines of an organic light emitting display, the method comprising:
   cutting the second wiring line so that an isolated part of the second wiring line comprising the short is isolated from first and second remaining parts of the second wiring line;
   cutting a third wiring line so that an isolated part of the third wiring line is adjacent to the isolated part of the second wiring line, wherein the isolated part of the third wiring line is isolated from first and second remaining parts of the third wiring line, wherein the first and second remaining parts of the third wiring line are isolated from one another; and
   forming a first repair pattern to electrically couple the first and second remaining parts of the second wiring line to the isolated part of the third wiring line,
   wherein the third wiring line is configured to receive signals from both of the first and second remaining parts of the third wiring line.

9. The method as claimed in claim 8, further comprising electrically coupling the first and second remaining parts of the third wiring line using a fourth wiring line adjacent to the third wiring line.

10. The method as claimed in claim 9, wherein coupling the first and second remaining parts of the third wiring line comprises:
    cutting the fourth wiring line so that an isolated part of the fourth wiring line is adjacent to the isolated part of the third wiring line, wherein the isolated part of the fourth wiring line is isolated from first and second remaining parts of the fourth wiring line; and
    forming a second repair pattern to electrically couple the first and second remaining parts of the third wiring line to the isolated part of the fourth wiring line.

11. The method as claimed in claim 10, wherein the fourth wiring line is configured to receive signals from both of the first and second remaining parts of the fourth wiring line.

12. The method as claimed in claim 10, further comprising forming a third repair pattern to electrically couple the first and second remaining parts of the fourth wiring line.

13. A method of repairing an open defect in a first wiring line of an organic light emitting display, the first wiring line comprising first and second parts separated by the open, the method comprising:
    cutting a second wiring line so that an isolated part of the second wiring line is adjacent to the open in the first wiring line, wherein the isolated part of the second wiring line is isolated from first and second remaining parts of the second wiring line and wherein the first and second remaining parts of the second wiring line are isolated from one another; and
    forming a first repair pattern to electrically couple the first and second parts of the first wiring line to the isolated part of the second wiring line,
    wherein the second wiring line is configured to receive signals from both of the first and second remaining parts of the second wiring line.

14. The method as claimed in claim 13, further comprising electrically coupling the first and second remaining parts of the second wiring line using a third wiring line.

15. The method as claimed in claim 14, wherein coupling the first and second remaining parts of the second wiring line comprises:
    cutting the third wiring line so that an isolated part of the third wiring line is adjacent to the isolated part of the second wiring line, wherein the isolated part of the third wiring line is isolated from first and second remaining parts of the third wiring line; and
    forming a second repair pattern to electrically couple the first and second remaining parts of the second wiring line to the isolated part of the third wiring line.

16. The method as claimed in claim 15, wherein the third wiring line is configured to receive signals from both of the first and second remaining parts of the third wiring line.

17. The method as claimed in claim 15, further comprising forming a third repair pattern to electrically couple the first and second remaining parts of the third wiring line.

* * * * *